United States Patent
Tian et al.

(10) Patent No.: US 11,406,037 B2
(45) Date of Patent: Aug. 2, 2022

(54) SERVER CHASSIS

(71) Applicants: Inventec (Pudong) Technology Corporation, Shanghai (CN); INVENTEC CORPORATION, Taipei (TW)

(72) Inventors: Guang-Zhao Tian, Shanghai (CN); Zhao Geng, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/151,869

(22) Filed: Jan. 19, 2021

(65) Prior Publication Data

US 2021/0378126 A1 Dec. 2, 2021

(30) Foreign Application Priority Data

May 29, 2020 (CN) .......................... 202010479584.0

(51) Int. Cl.
*H05K 7/14* (2006.01)
*H05K 5/02* (2006.01)
*H05K 7/16* (2006.01)

(52) U.S. Cl.
CPC ........... *H05K 7/1489* (2013.01); *H05K 5/023* (2013.01); *H05K 7/16* (2013.01)

(58) Field of Classification Search
None
See application file for complete search history.

(56) References Cited

U.S. PATENT DOCUMENTS

| | | | |
|---|---|---|---|
| 6,582,241 B1 * | 6/2003 | Lutz, Jr. | H05K 7/1409 439/157 |
| 9,122,458 B2 * | 9/2015 | Yu | G06F 1/185 |
| 10,096,343 B1 * | 10/2018 | Linares Rivas | G11B 33/08 |
| 10,383,248 B1 * | 8/2019 | Chen | H05K 7/1489 |
| 10,888,025 B2 * | 1/2021 | Wu | H05K 7/20172 |
| 2006/0171110 A1 * | 8/2006 | Li | G06F 1/184 361/679.37 |
| 2012/0248952 A1 * | 10/2012 | Gong | H05K 7/1494 312/244 |
| 2020/0068742 A1 * | 2/2020 | Tsorng | F04D 29/703 |
| 2021/0068317 A1 * | 3/2021 | Wang | G06F 1/187 |

* cited by examiner

*Primary Examiner* — James Wu
*Assistant Examiner* — Christopher L Augustin
(74) *Attorney, Agent, or Firm* — Locke Lord LLP; Tim Tingkang Xia, Esq.

(57) ABSTRACT

A server chassis including rack and mount cage. Mount cage includes cage part and handle. Cage part is fixed on a side of the rack. Handle includes pivot part, handheld part, and protruding part. Handheld part and protruding part are respectively connected to two opposite sides of pivot part, and pivot part is pivotally connected to cage part. Protruding part has first side surface located on a side of protruding part that is located away from pivot part. An axis of pivot part is spaced apart from first side surface by first distance along first direction. Pivot part is spaced apart from first side surface by second distance along second direction. First direction is different from the second direction, and first distance is different from second distance.

10 Claims, 7 Drawing Sheets

SERVER CHASSIS

CROSS-REFERENCE TO RELATED APPLICATIONS

This non-provisional application claims priority under 35 U.S.C. § 119(a) on Patent Application No(s). 202010479584.0 filed in China, on May 29, 2020, the entire contents of which are hereby incorporated by reference.

BACKGROUND OF THE INVENTION

Technical Field of the Invention

The invention relates to a server chassis, more particularly to a server chassis including a handle.

Description of the Related Art

With the development of the cloud technology, a server is required to accommodate more and more electronic components (e.g., processors or storage devices) to reach the required performance. For the convenience of changing or maintaining the electronic components in the server, the cage for the placements of the electronic components has a handle for users to easily install/remove the cage.

It is understood that the weight on the cage increases with the number of electronic components, such that moving the cage via the handle is still very laborious. This problem makes the maintenance process troublesome and difficult. Thus, there is a demand for a handle for easing the effort for the installation/removal of the cage.

SUMMARY OF THE INVENTION

The invention is to provide a server chassis having a handle to achieve an easy installation/removal of a cage.

One embodiment of this invention provides a server chassis including a rack and a mount cage. The mount cage includes a cage part and a handle. The cage part is fixed on a side of the rack. The handle includes at least one pivot part, a handheld part, and at least one protruding part. The handheld part and the at least one protruding part are respectively connected to two opposite sides of the at least one pivot part, and the at least one pivot part is pivotally connected to the cage part. The protruding part has a first side surface located on a side of the protruding part that is located away from the at least one pivot part. An axis of the at least one pivot part is spaced apart from the first side surface by a first distance along a first direction. The at least one pivot part is spaced apart from the first side surface by a second distance along a second direction. The first direction is different from the second direction, and the first distance is different from the second distance.

Another embodiment of this invention provides a server chassis including a rack and a mount cage. The mount cage includes a cage part and a handle. The cage part is fixed on a side of the rack and having an engagement slot. The handle includes a pivot part, a handheld part and an engagement part. The handheld part and the engagement part are respectively connected to two sides of the pivot part. The pivot part pivotally is connected to the cage part. The engagement part has a first side surface located on a side of the engagement part located close to the pivot part. An axis of the pivot part is spaced apart from the first side surface by a first distance along a first direction. The axis of the pivot part is spaced apart from the first side surface by a second distance along a second direction. The first direction is different from the second direction, and the first distance is different from the second distance.

According to the server chassis discussed in the above embodiments, since the side surface of the protruding part or the side surface of the engagement part is spaced apart from the axis of the pivot part by different distances along different directions, the protruding part or the engagement part can respectively help the cage part of the mount cage to move away from or toward the rack. This achieves a labor-saving mechanism for mounting the mount cage on the rack or removing the mount cage from the rack, and thus there is no need to put too much effort to move the handheld part for the purpose of mounting or removing the mount cage.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
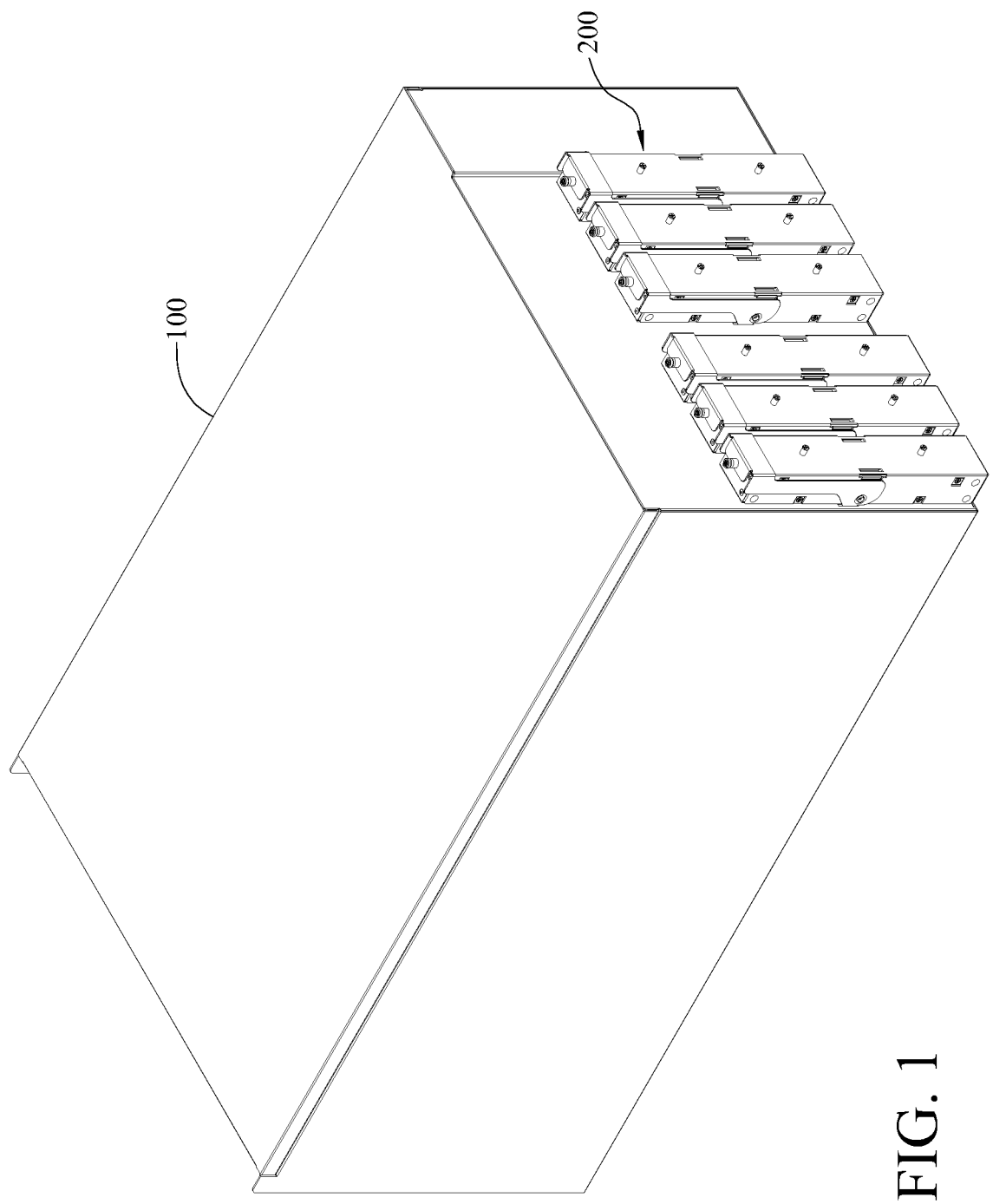
FIG. 1 is a perspective view of a server chassis according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
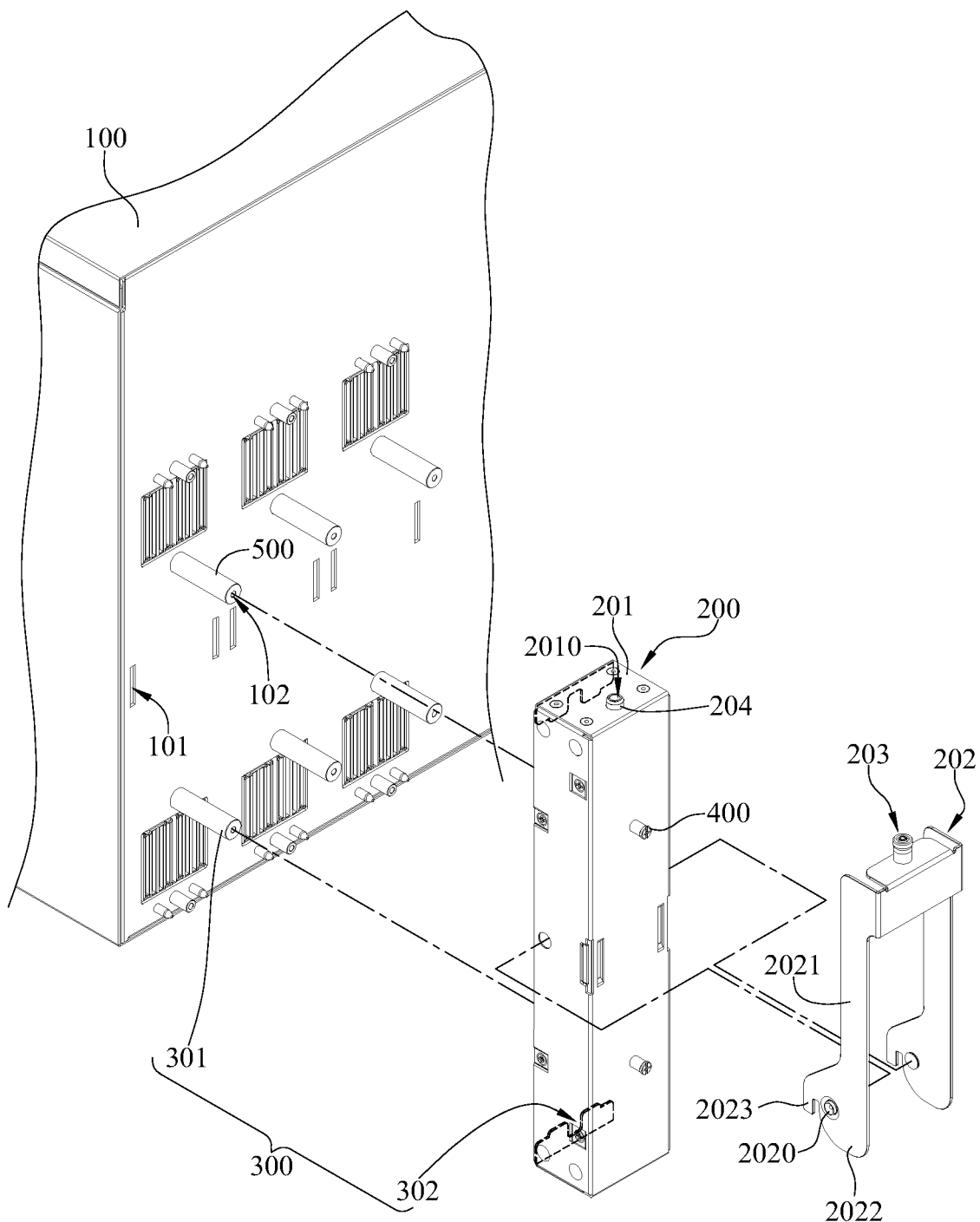
FIG. 2 is a partially enlarged exploded view of the server chassis in FIG. 1.

Please refer to FIG. 1 and FIG. 2, there are shown a perspective view of a server chassis according to an embodiment of the invention, and a partially enlarged exploded view of the server chassis in FIG. 1.

In this embodiment, the server chassis 10 includes a rack 100, a plurality of mount cages 200, a first positioning assembly 300, a plurality of fasteners 400, and a plurality of pillars 500. In this embodiment, the rack 100 has a plurality of engagement slots 101.

It is noted that, for the purpose of simple explanation, only the detail and operation of one of the mount cages 200 will be described hereinafter. In this embodiment, the mount cage 200 includes a cage part 201, a handle 202, a second positioning assembly 203, and a guide structure 204. The cage part 201 is fixed on a side of the rack 100 and has a positioning hole 2010.

Figure 3:
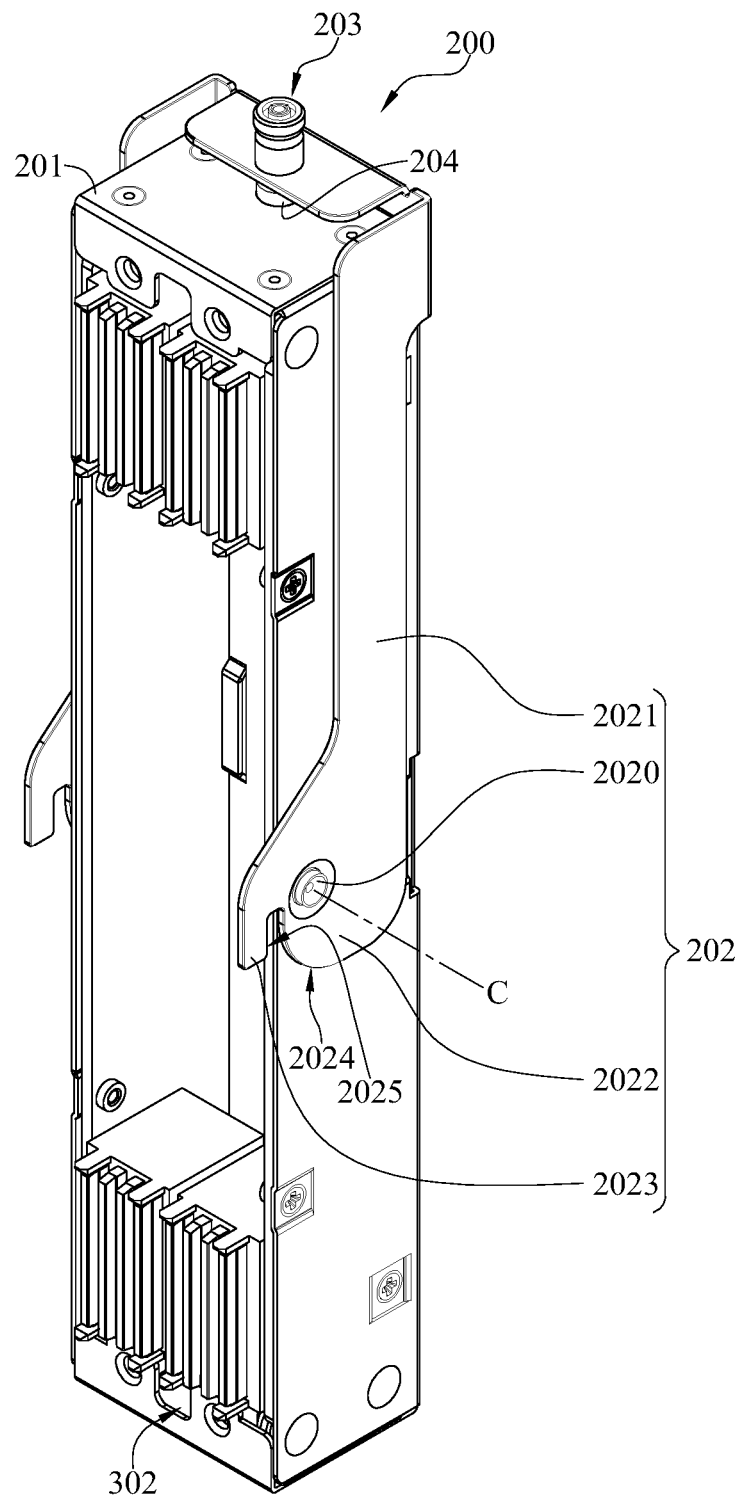
FIG. 3 is a perspective view of a mount of the server chassis in FIG. 1.
Figure 4:
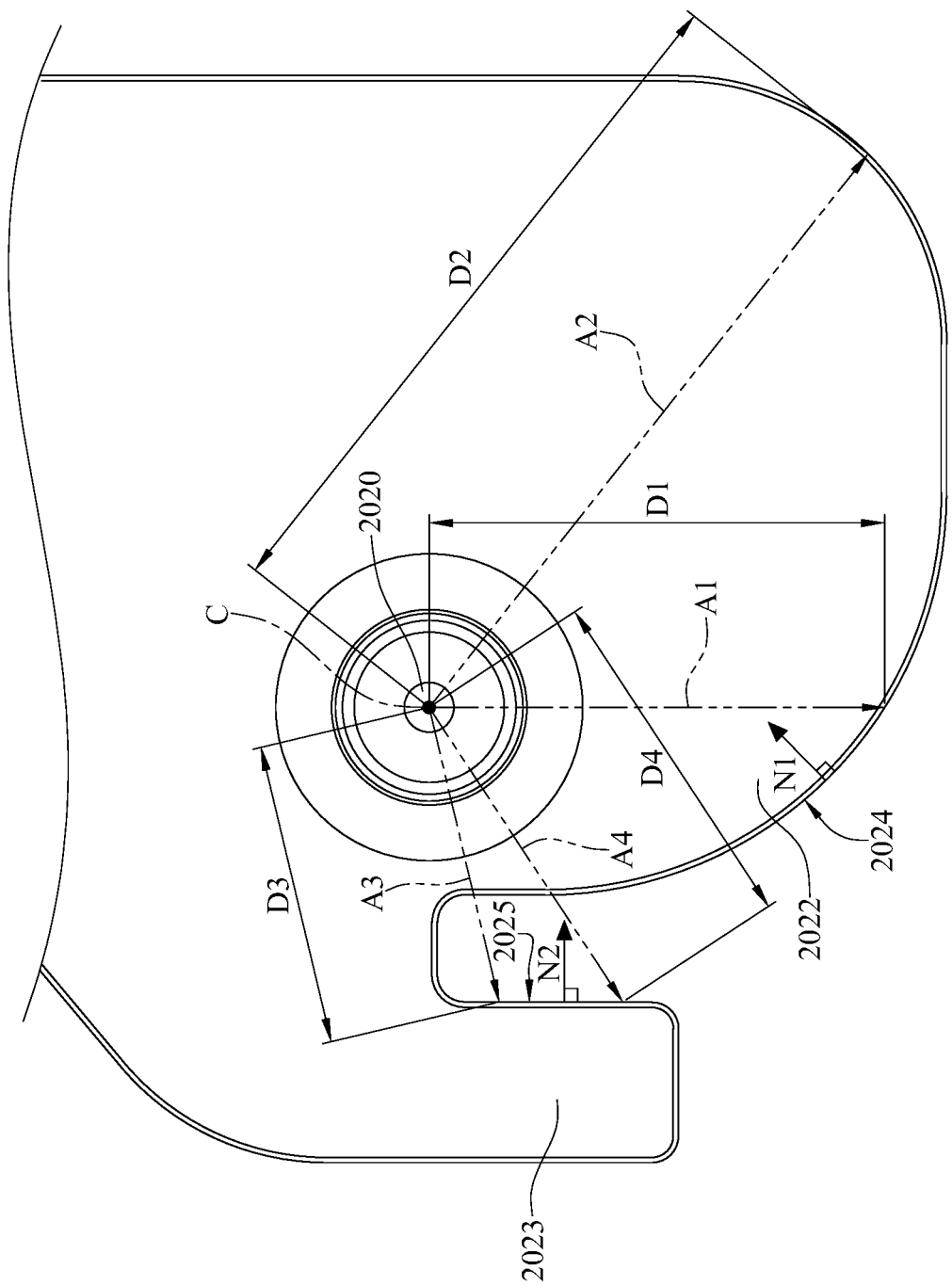
FIG. 4 is a partially enlarged side view of the mount in FIG. 3.

Please also refer to FIG. 3 and FIG. 4, there are shown a perspective view of a mount cage of the server chassis in FIG. 1, and a partially enlarged side view of the mount cage in FIG. 3.

The handle 202 includes two pivot parts 2020, a handheld part 2021, two protruding parts 2022, and two engagement parts 2023. The pivot parts 2020 are respectively pivotally connected to two opposite sides of the cage part 201. The handheld part 2021 connects the two pivot parts 2020, and the protruding parts 2022 respectively protrude from the two pivot parts 2020. That is, the handheld part 2021 and one of the protruding parts 2022 are respectively connected to two opposite sides of one of the pivot parts 2020, and the handheld part 2021 and the other one of the protruding parts 2022 are respectively connected to two opposite sides of the other one of the pivot part 2020. The engagement parts 2023 respectively protrude from the pivot parts 2020 and are detachably engaged with the respective engagement slots 101 of the rack 100.

Note that the term "perpendicular" herein may be used to describe one line or plane that is at a right angle to another line or plane but the pair of lines and planes do not have to actually intersect with each other. As shown in FIG. 4, the protruding part 2022 has a first side surface 2024 having a normal line N1 perpendicular to an axis C of the pivot part 2020. In a first direction A1, the axis C of the pivot part 2020 and the first side surface 2024 are spaced apart from each other by a first distance D1. In a second direction A2, the axis C of the pivot part 2020 and the first side surface 2024 are spaced apart from each other by a second distance D2. The first direction A1 is different from the second direction A2, and the first distance D1 is different from the second distance D2. In other words, different parts of the first side surface 2024 are spaced different distances to the axis C of the pivot part 2020.

As shown in FIG. 4, the engagement part 2023 has a second side surface 2025. The second side surface 2025 is located on a side of the engagement part 2023 that is located closer to the pivot part 2020. Also, the second side surface 2025 has a normal line N2 perpendicular to the axis C of the pivot part 2020. In a third direction A3, the axis C of the pivot part 2020 and the second side surface 2025 are spaced apart from each other by a third distance D3. In a fourth direction A4, the axis C of the pivot part 2020 and the second side surface 2025 are spaced apart from each other by a fourth distance D4. The third direction A3 is different from the fourth direction A4, and the third distance D3 is different from the fourth distance D4. In other words, different parts of the second side surface 2025 are spaced different distances to the axis C of the pivot part 2020.

Note that the quantities of the pivot parts 2020, the protruding parts 2022, and the engagement parts 2023 of the handle 202 are not restricted. In other embodiments, there may be only one pivot part, one protruding part, and one engagement part on the handle.

Note that the protruding parts 2022 and the engagement parts 2023 are optional. In other embodiments, the handle may not include the protruding parts 2022 or the engagement parts 2023. In the embodiment where the handle includes the protruding parts 2022 but does not include the engagement parts 2023, the rack may omit the engagement slot 101 for the engagement with the engagement part.

Figure 5:
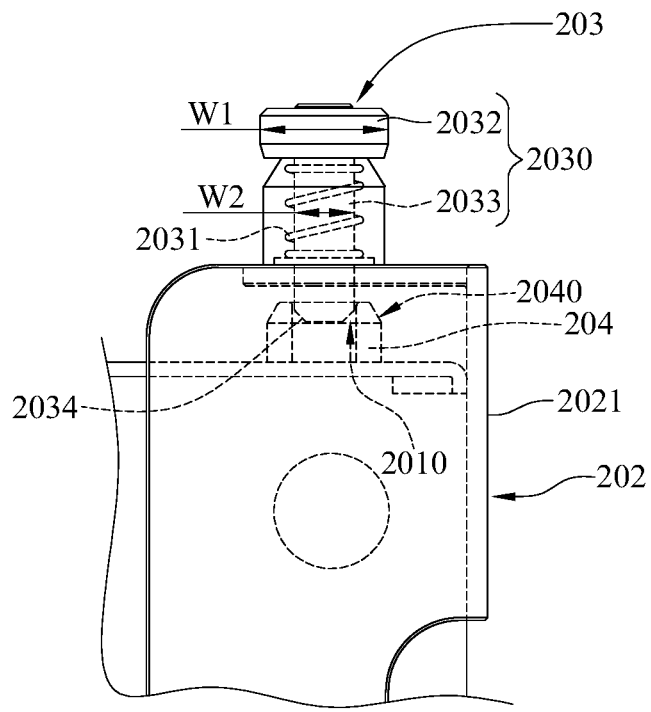
FIG. 5 is a partially enlarged side view showing that a movable component is in a positioning hole of a cage part of the mount.
Figure 6:
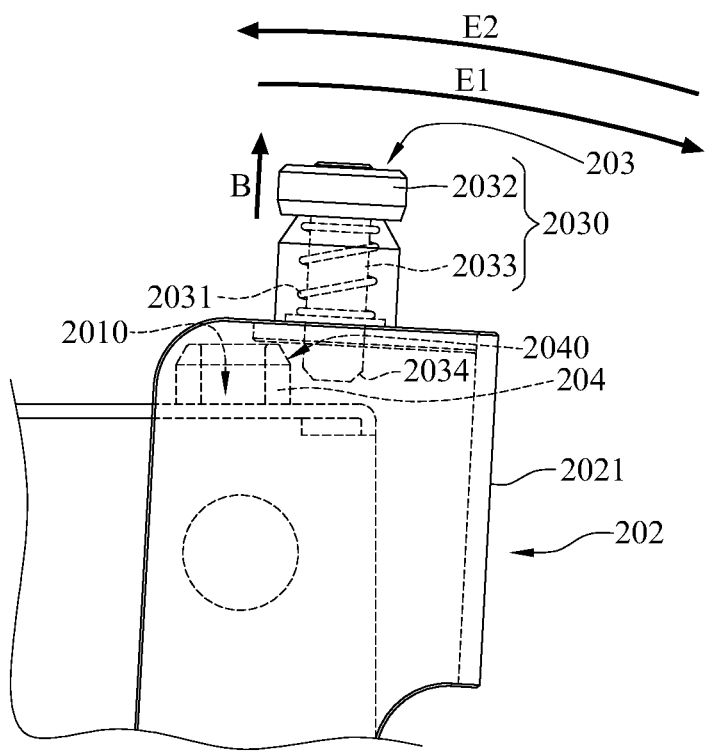
FIG. 6 is a partially enlarged side view showing that the movable component is detached from the positioning hole of the cage part of the mount.

Please refer to FIG. 5 and FIG. 6, where FIG. 5 is a partially enlarged side view showing that a movable component is in a positioning hole of a cage part of the mount cage, and FIG. 6 is a partially enlarged side view showing that the movable component is detached from the positioning hole of the cage part of the mount cage.

In this embodiment, the second positioning assembly 203 includes a movable component 2030 and an elastic component 2031. The movable component 2030 is disposed through the handheld part 2021 of the handle 202 and is movably disposed on the handheld part 2021 of the handle 202 via the elastic component 2031, such that the movable component 2030 is detachably positioned in the positioning hole 2010 of the cage part 201 of the mount cage 200. In more detail, the movable component 2030 includes a wider portion 2032 and a narrower portion 2033 connected to each other, where a first diameter W1 of the wider portion 2032 is larger than a second diameter W2 of the narrower portion 2033. The narrower portion 2033 is disposed through the handheld part 2021 of the handle 202. Two opposite ends of the elastic component 2031 are respectively fixed to the handheld part 2021 of the handle 202 and the wider portion 2032 of the movable component 2030. In this embodiment, the elastic component 2031 is, for example, a compression spring.

The guide structure 204 protrudes form a side of the cage part 201 of the mount cage 200 and the positioning hole 2010 is located at the guide structure 204. The guide structure 204 has a first inclined guiding surface 2040, and the narrower portion 2033 of the movable component 2030 has a second inclined guiding surface 2034.

As shown in FIG. 5, when the narrower portion 2033 of the movable component 2030 is positioned in the positioning hole 2010 of the cage part 201, the handheld part 2021 where the narrower portion 2033 is disposed through is held in position and the wider portion 2032 rests on the handheld part 2021 of the handle 202.

As shown in FIG. 6, when the wider portion 2032 of the movable component 2030 is pulled upwards along a pulling direction B and then the handheld part 2021 is pulled along a removing direction E1, the narrower portion 2033 of the movable component 2030 is detached from the positioning hole 2010 of the cage part 201, and the stretched elastic component 2031 can force the wider portion 2032 to move back to rest on the handheld part 2021 of the handle 202.

Further, to reposition the narrower portion 2033 of the movable component 2030 to the position hole 2010, it only needs to pull the wider portion 2032 of the movable component 2030 upwards and then move the handheld part 2021 along a mounting direction E2 opposite to the removing direction E1, and the stretched elastic component 2031 will force the wider portion 2032 to move toward the positioning hole 2010 of the cage part 201. When the wider portion 2032 is moved toward the positioning hole 2010 of the cage part 201, the narrower portion 2033 can be moved back to the positioning hole 2010 of the cage part 201 by the cooperation of the first inclined guiding surface 2040 of the guide structure 204 and the second inclined guiding surface 2034 of the narrower portion 2033.

Note that the configuration of the movable component 2030 is not restricted to include the wider portion 2032 and the narrower portion 2033 of different diameters. In other embodiments, the movable component may be a cylinder with fixed diameter and may be fixed to the handheld part via press-fit.

Note that the second positioning assembly 203 is optional. In other embodiments, the mount cage may omit the second positioning assembly 203 and may be positioned on the cage part via press-fit.

Note that the guide structure 204 is also optional. In other embodiments, the mount cage may omit the guide structure 204, and the narrower portion may not have the second inclined guiding surface.

Then, please refer to FIG. 2 and FIG. 3, the first positioning assembly 300 includes a plurality of first positioning structures 301 and a plurality of second positioning structures 302. The first positioning structures 301 are located on a side of the rack 100 that is configured to fix the cage part 201 of the mount cage 200 and are, for example, positioning pillars. The second positioning structures 302 are located on the cage part 201 of the mount cage 200 and are respectively detachably positioned in the first positioning structures 301, where the second positioning structures 302 are, for example, positioning holes.

Note that the quantities of the first positioning structures 301 and the second positioning structures 302 are not restricted. In other embodiments, there may be only one first positioning structure and one second positioning structure respectively on the rack 100 and cage part 201 depends on the quantity of the mount cage. In addition, note that the first positioning assembly 300 is optional; in other embodiments, there may be no first positioning assembly 300 in the server chassis.

Please refer to FIG. 2, the rack 100 further has a plurality of holes 102, that are, for example, screw holes. The pillars 500 protrude from a side of the rack 100 that is configured to fix the mount cages 200, and the holes 102 are respectively located on the pillars 500. The fasteners 400 are, for example, thumb screws, and are respectively screwed into the holes 102 so as to fix the cage part 201 of the mount cage 200 to the rack 100.

Note that the quantities of the fasteners 400, the holes 102, and the pillars 500 are not restricted. In other embodiments, there may be one fastener fixed in one hole on one pillar. In addition, the pillars 500 are optional. In other embodiments, the server chassis may omit the pillar 500 and the hole may be located on a surface of the rack where the mount cage is fixed. Moreover, the fasteners 400 and the holes 102 are also optional. In other embodiments, the server chassis may omit the fastener 400 and the rack may omit the hole 102.

Figure 7:
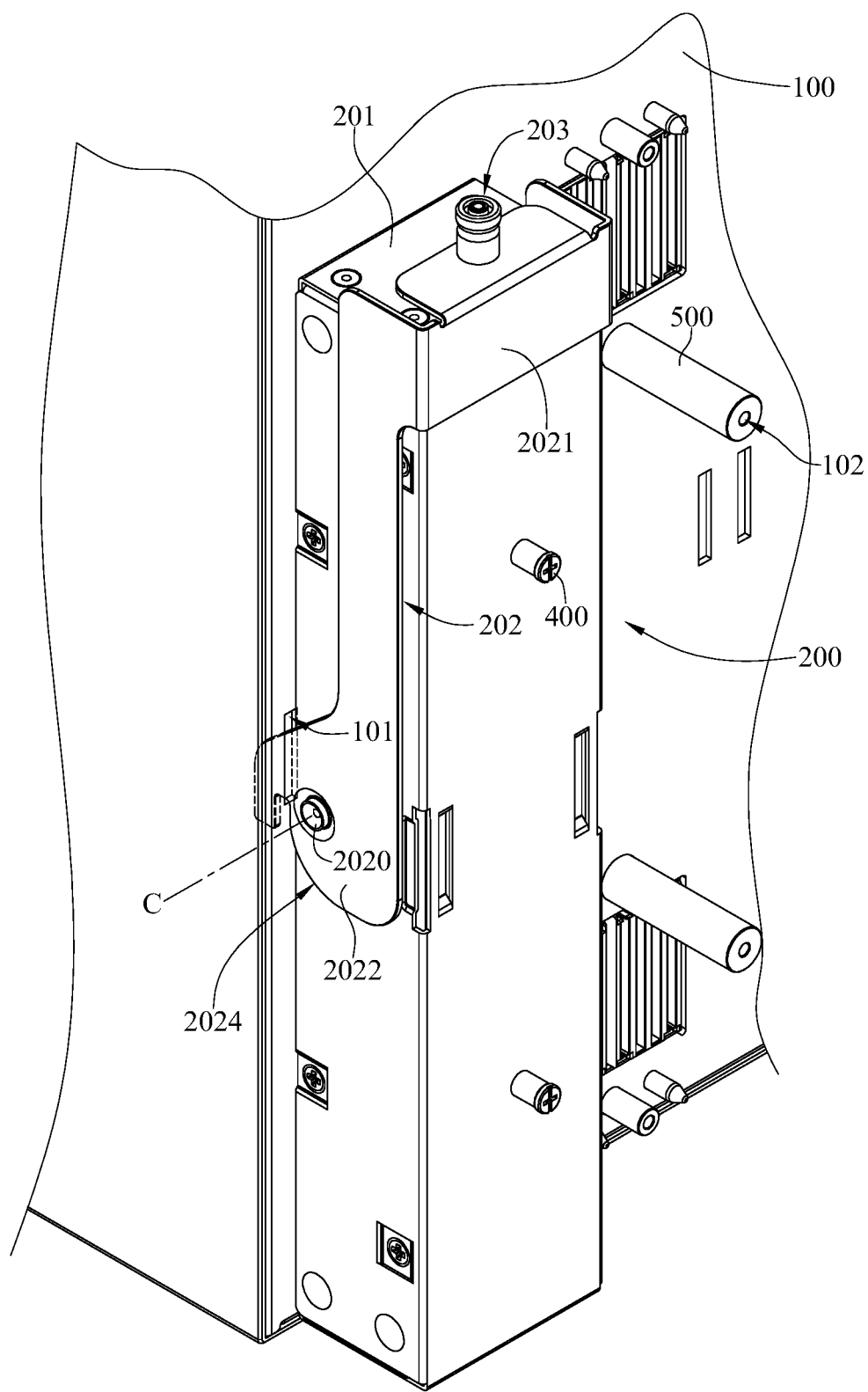
FIG. 7 is a partially enlarged perspective view showing that the mount is mounted on the rack.
Figure 8:
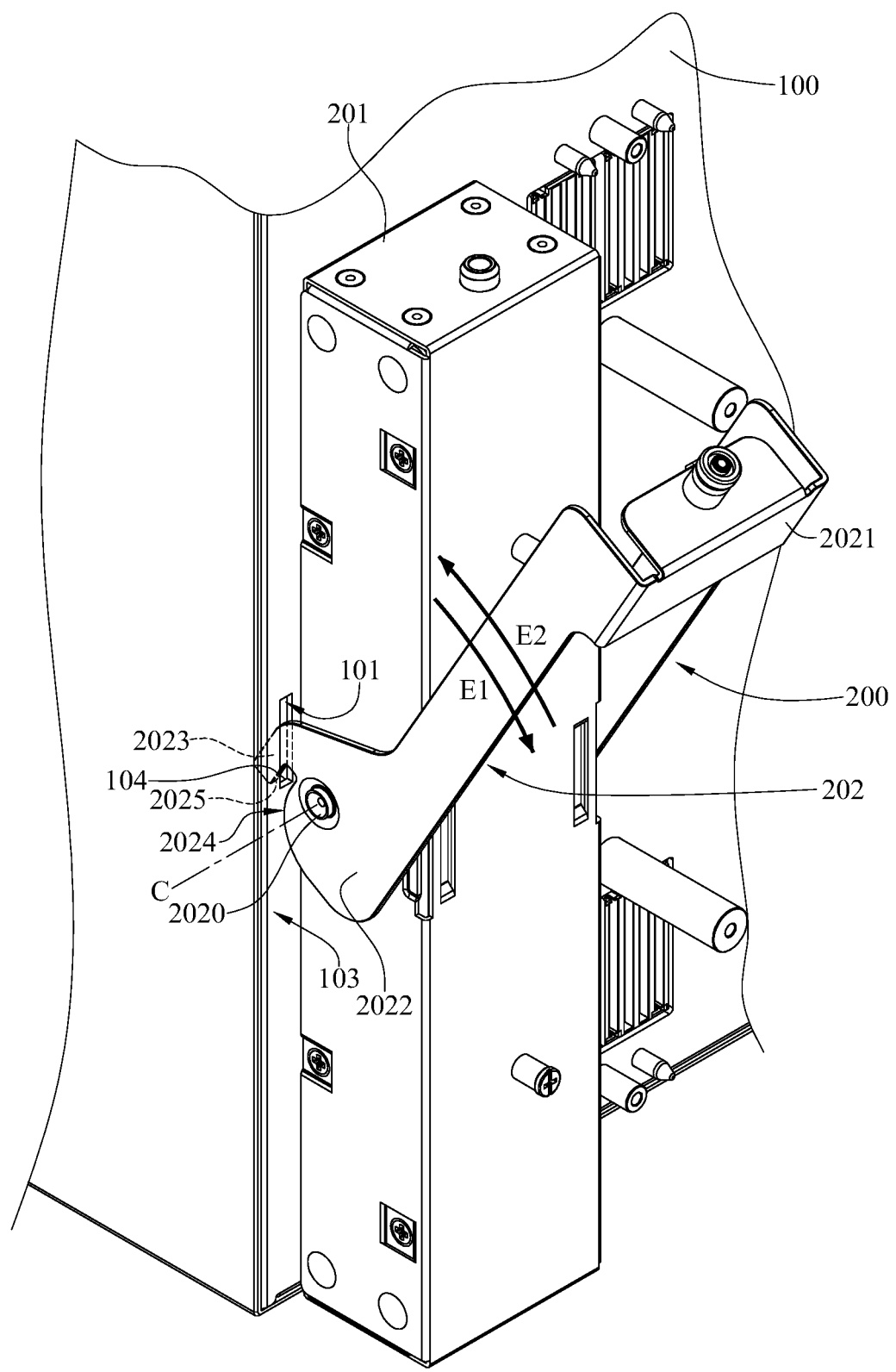
FIG. 8 is a partially enlarged perspective view showing that the mount is detached from the rack.

Then, the installation/removal processes of the cage part 201 of the mount cage 200 with respect to the rack 100 via the handle 202 will be described hereinafter. Please refer to FIG. 6, FIG. 7 and FIG. 8, where FIG. 7 is a partially enlarged perspective view showing that the mount cage is mounted on the rack, and FIG. 8 is a partially enlarged perspective view showing that the mount cage is detached from the rack.

The process of removing the mount cage 200 from the rack 100 is firstly described. After the fastener 400 has been detached from the hole 102 located on the pillar 500 and the movable component 2030 has been detached from the positioning hole 2010 of the cage part 201, the handheld part 2021 can be pivoted relative to the pivot part 2020 by being pulled along the removing direction E1. As shown in FIG. 8, since the axis C of the pivot part 2020 and the first side surface 2024 of the protruding part 2022 are spaced apart from each other by different distances along different directions, the protruding part 2022 can push the outer surface 103 of the rack 100 to assist the cage part 201 in moving away from the rack 100 while the handheld part 2021 is pivoted along the removing direction E1. This achieves a labor-saving mechanism for removing the mount cage 200 from the rack 100, and thus there is no need to put too much effort to move the handheld part 2021 for the purpose of the removal of the mount cage 200.

Next, the process of mounting the mount cage 200 on the rack 100 is described. The handheld part 2021 can be pivoted relative to the pivot part 2020 by being pulled along the mounting direction E2. As shown in FIG. 8, since the axis C of the pivot part 2020 and the second side surface 2025 of the engagement part 2023 are spaced apart from each other by different distances along different directions, the engagement part 2023 can push the inner surface 104 of the rack 100 to assist the cage part 201 in moving toward the rack 100 while the handheld part 2021 is pivoted along the mounting direction E2. This achieves a labor-saving mechanism for mounting the mount cage 200 on the rack 100, and thus there is no need to put too much effort to move the handheld part 2021 for the purpose of mounting the mount cage 200.

According to the server chassis discussed in the above embodiments, since the side surface of the protruding part or the side surface of the engagement part is spaced apart from the axis of the pivot part by different distances along different directions, the protruding part or the engagement part can respectively help the cage part of the mount cage to move away from or toward the rack. This achieves a labor-saving mechanism for mounting the mount cage on the rack or removing the mount cage from the rack, and thus there is no need to put too much effort to move the handheld part for the purpose of mounting or removing the mount cage.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server chassis, comprising:
   a rack; and
   a mount cage, mounted to an exterior of the rack, and the mount cage comprising:
   a cage part, fixed on a side of the rack; and
   a handle, comprising at least one pivot part, a handheld part, and at least one protruding part, the handheld part and the at least one protruding part respectively connected to two opposite sides of the at least one pivot part, and the at least one pivot part pivotally connected to the cage part;
   wherein, the at least one protruding part has a first side surface located on a side of the at least one protruding part that is located away from the at least one pivot part, an axis of the at least one pivot part is spaced apart from the first side surface by a first distance along a first direction, the at least one pivot part is spaced apart from the first side surface by a second distance along a second direction, the first direction is different from the second direction, and the first distance is different from the second distance.

2. The server chassis according to claim 1, wherein the handle further comprises an engagement part, the rack has an engagement slot, the engagement part protrudes from the at least one pivot part and is detachably engaged in the engagement slot of the rack, the engagement part has a second side surface, the second side surface is located on a side of the engagement part that is located close to the at least one pivot part, the axis of the at least one pivot part is spaced apart from the second side surface by a third distance along a third direction, the axis of the at least one pivot part is spaced apart from the second side surface by a fourth distance along a fourth direction, the third direction is different from the fourth direction, and the third distance is different from the fourth distance.

3. The server chassis according to claim 1, wherein the mount cage further comprises a positioning assembly, and the cage part has a positioning hole, the positioning assembly comprises a movable component and an elastic component, the movable component is disposed through the handheld part of the handle and is movably disposed on the handheld part of the handle via the elastic component so that the movable component is detachably positioned in the positioning hole of the cage part.

4. The server chassis according to claim 3, wherein the movable component comprises a wider portion and a narrower portion that are connected to each other, a first diameter of the wider portion is larger than a second diameter of the narrower portion, the narrower portion penetrates through the handheld part of the handle, two opposite ends of the elastic component are respectively fixed to the handheld part of the handle and the wider portion of the movable component, when the narrower portion of the movable component is positioned in the positioning hole of the cage part, the wider portion rests on the handheld part of the handle.

5. The server chassis according to claim 3, wherein the mount cage further comprises a guide structure, the guide structure protrudes from a side of the cage part of the mount cage and the positioning hole is located at the guide structure, the guide structure has a first inclined guiding surface, and the movable component has a second inclined guiding surface.

6. The server chassis according to claim 1, further comprising a positioning assembly comprising a first positioning structure and a second positioning structure, wherein the first positioning structure is located on the side of the rack where the cage part of the mount cage is fixed, the second positioning structure is located on the cage part of the mount cage and is detachably positioned in the first positioning structure.

7. The server chassis according to claim 1, wherein a quantity of the at least one pivot part is two and a quantity of the at least one protruding part is two, the two pivot parts are respectively pivotally connected to two opposite sides of the cage part, and the two protruding parts respectively connected to sides of the two pivot parts that are located away from the handheld part.

8. The server chassis according to claim 1, further comprising a fastener, the rack having a hole, and the fastener fixed in the hole so as to fix the cage part of the mount cage to the rack.

9. The server chassis according to claim 8, further comprising a pillar, the pillar protruding from the side of the rack where the cage part of the mount cage is fixed and the hole located on the pillar.

10. A server chassis, comprising:
a rack; and
a mount cage, mounted to an exterior of the rack, and the mount cage comprising:
 a cage part, fixed on a side of the rack and having an engagement slot; and
 a handle, comprising a pivot part, a handheld part and an engagement part, the handheld part and the engagement part respectively connected to two sides of the pivot part, the pivot part pivotally connected to the cage part;
wherein, the engagement part has a first side surface located on a side of the engagement part located close to the pivot part, an axis of the pivot part is spaced apart from the first side surface by a first distance along a first direction, the axis of the pivot part is spaced apart from the first side surface by a second distance along a second direction, the first direction is different from the second direction, and the first distance is different from the second distance.

* * * * *